United States Patent
Ueno

(10) Patent No.: US 8,462,029 B2
(45) Date of Patent: Jun. 11, 2013

(54) ANALOG-TO-DIGITAL CONVERSION APPARATUS AND SIGNAL PROCESSING SYSTEM

(75) Inventor: Yosuke Ueno, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/474,274

(22) Filed: May 17, 2012

(65) Prior Publication Data

US 2012/0306672 A1 Dec. 6, 2012

(30) Foreign Application Priority Data

May 31, 2011 (JP) .................................. 2011-121921

(51) Int. Cl.
*H03M 1/06* (2006.01)
(52) U.S. Cl.
USPC ............................. 341/118; 341/155; 341/156
(58) Field of Classification Search
USPC .................................................. 341/118, 156
See application file for complete search history.

(56) References Cited

U.S. PATENT DOCUMENTS

| 7,053,804 B1* | 5/2006 | Nairn ............................ 341/118 |
| 7,808,408 B2* | 10/2010 | Madisetti et al. ............. 341/118 |
| 7,898,446 B2* | 3/2011 | Nagarajan et al. ............ 341/118 |

FOREIGN PATENT DOCUMENTS

| JP | 2006-025399 | 1/2006 |
| JP | 2006-135934 | 5/2006 |

* cited by examiner

*Primary Examiner* — Khai M Nguyen
(74) *Attorney, Agent, or Firm* — Rader, Fishman & Grauer PLLC

(57) ABSTRACT

An analog-to-digital conversion apparatus includes: a first analog-to-digital converter and a second analog-to-digital converter that are configured to convert an input analog signal into a digital signal; a difference imparting part configured to provide a difference of at least a fixed signal α between input analog signals to the first and second analog-to-digital converters, to input the input analog signals thereto; a first non-linear compensation part and a second non-linear compensation part that are configured to compensate non-linear distortions of a first output signal and a second output signal depending on the control variable signal to be supplied; and a non-linear detection part configured to estimate how much the non-linear distortions are compensated by the first and second non-linear compensation parts depending on a first signal by the first non-linear compensation part and a second signal by the second non-linear compensation part.

10 Claims, 11 Drawing Sheets

FIG.3
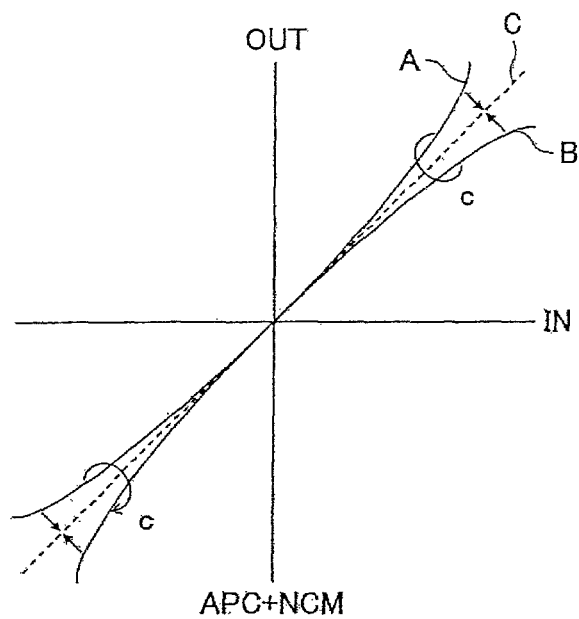
FIG.4
FIG.4A
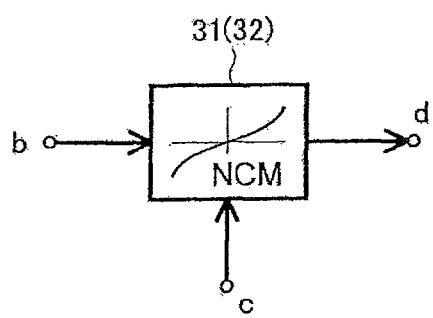
FIG.4B
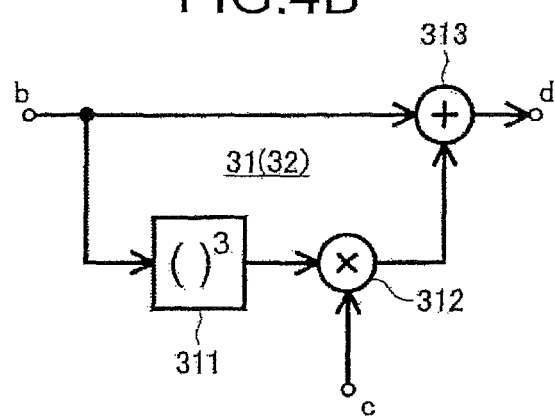

Continuous-time system second-order low-pass Δ Σ modulator

FIG.10
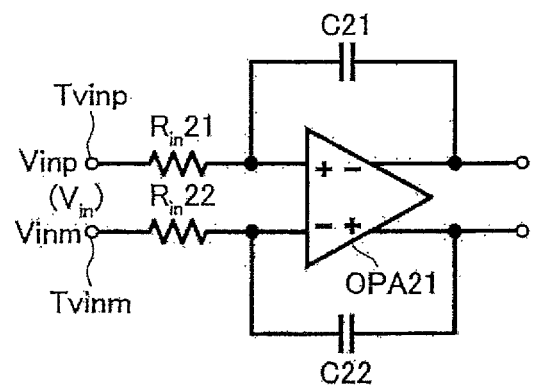
FIG.10A
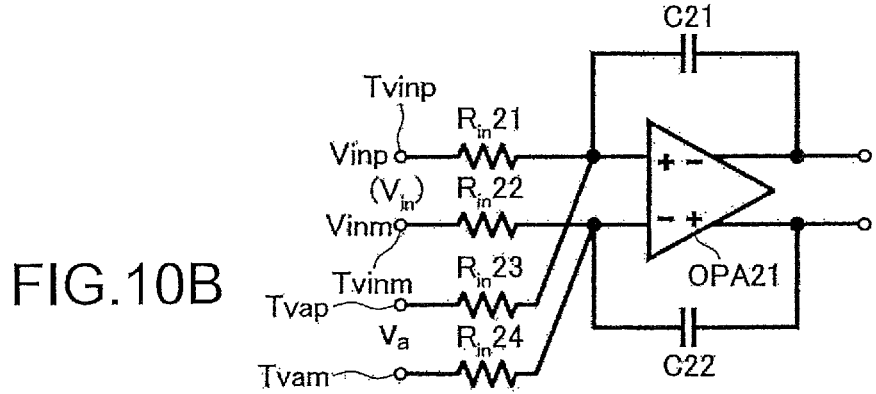
FIG.10B

ANALOG-TO-DIGITAL CONVERSION APPARATUS AND SIGNAL PROCESSING SYSTEM

BACKGROUND

The present technology relates to an analog-to-digital (AD) conversion apparatus and a signal processing system that are configured to be applied to a receiver in radio communication, and furthermore an audio device, a medical measuring device, and the like.

FIG. 1 is a diagram showing an outline structure of an AD converter (ADC; Analog-to-Digital Converter).

In FIG. 1, X represents an input voltage of an AD converter 1, and the input voltage X is an analog signal. Meanwhile, Y represents an output voltage of the AD converter 1, and the output voltage Y is a digital signal.

The AD converter 1 generates a distortion caused by non-ideal characteristics of circuit elements used inside. When a circuit has a distortion, the output includes not only fundamental wave components of a signal but also harmonic components.

In the harmonic components, even-order components may have a sufficient attenuation amount with an AD converter having an all-differential structure, but odd-order components appear in the output as they are.

When the AD converter 1 shown in FIG. 1 has distortion characteristics, the output Y with respect to the comparatively small input X is expressed as the following formula 1.

$$Y = a_1 X + a_3 X^3 + a_5 X^5 + \ldots \quad \text{(Formula 1)}$$

In the formula, $a_i$ represents a gain of ith-order distortion components, and an even-order distortion is not assumed to be generated as mentioned above.

SUMMARY

As shown in the formula 1, as an input signal becomes larger, distortion components increase at a higher increasing rate.

Therefore, in order to improve distortion characteristics, an input signal is limited to be small in related art. In other words, an AD converter has a dynamic range limited by a distortion.

It is desirable to provide an AD conversion apparatus and a signal processing system that are capable of significantly improving AD conversion characteristics in which a dynamic range is limited by a distortion.

An analog-to-digital conversion apparatus according to a first embodiment of the present technology includes: a first analog-to-digital converter configured to convert an input analog signal into a digital signal; a second analog-to-digital converter configured to convert an input analog signal into a digital signal; a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively; a first non-linear compensation part configured to compensate a non-linear distortion of a first output signal of the first analog-to-digital converter depending on a control variable signal to be supplied; a second non-linear compensation part configured to compensate a non-linear distortion of a second output signal of the second analog-to-digital converter depending on the control variable signal to be supplied; and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

A signal processing system according to a second embodiment of the present technology includes an analog-to-digital conversion apparatus configured to convert an analog signal from an analog signal processing system into a digital signal, the analog-to-digital conversion apparatus including a first analog-to-digital converter configured to convert an input analog signal into a digital signal, a second analog-to-digital converter configured to convert an input analog signal into a digital signal, a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively, a first non-linear compensation part configured to compensate a non-linear distortion of a first output signal of the first analog-to-digital converter depending on a control variable signal to be supplied, a second non-linear compensation part configured to compensate a non-linear distortion of a second output signal of the second analog-to-digital converter depending on the control variable signal to be supplied, and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

According to the present technology, AD conversion characteristics in which a dynamic range is limited by a distortion may significantly improve.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a diagram explaining a concept of non-linear compensation in a non-linear compensation part according to the embodiment;

FIG. 4 are diagrams showing a structure example of a non-linear compensator according to the embodiment;

FIG. 10 are diagrams showing a structure example of an input part of the $\Delta\Sigma$ modulator in FIG. 9;

DETAILED DESCRIPTION OF EMBODIMENTS

Hereinafter, embodiments of the present technology will be described with reference to the drawings.

An explanation will be given in the following order.

1. First embodiment (first structure example of AD conversion apparatus that includes distortion compensation function)

2. Second embodiment (second structure example of AD conversion apparatus that includes distortion compensation function)

3. Third embodiment (third structure example of AD conversion apparatus that includes distortion compensation function)

4. Fourth embodiment (fourth structure example of AD conversion apparatus that includes distortion compensation function)

5. Fifth embodiment (structure example of signal processing system)

1. First Embodiment

Figure 1:
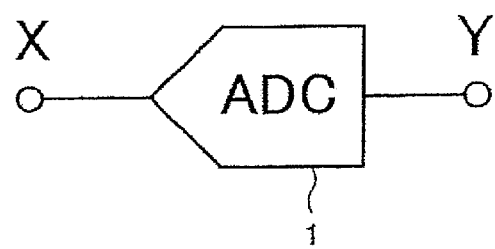
FIG. 1 is a diagram showing an outline structure of an AD converter (ADC)
Figure 2:
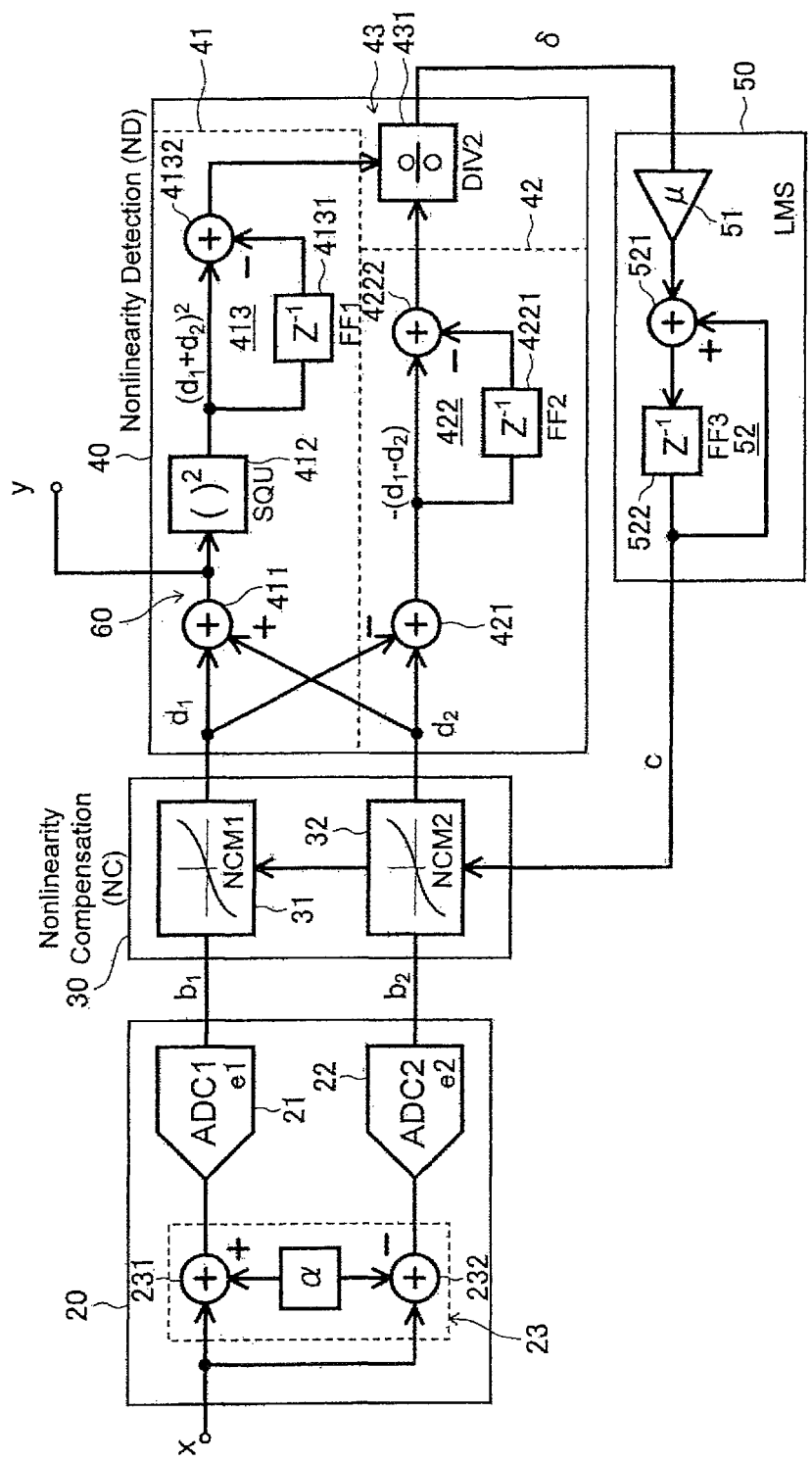
FIG. 2 is a diagram showing a structure of an AD conversion apparatus that includes a non-linear (distortion) compensation function according to a first embodiment.

FIG. 2 is a diagram showing a structure of an AD conversion apparatus that includes a non-linear (distortion) compensation function according to the first embodiment.

An AD conversion apparatus 10 according to the first embodiment includes, as shown in FIG. 2, an AD conversion part 20, a non-linear compensation part 30, a non-linear detection part 40, a filter 50, and an output part 60.

In this embodiment, a part of an input part of the non-linear detection part 40 and the output part 60 are shared with each other.

In FIG. 2, x represents an input voltage of the AD conversion apparatus 10, and the input voltage x is an analog signal. Meanwhile, y represents an output voltage of the AD conversion apparatus 10, and the output voltage y is a digital signal.

The AD conversion part 20 includes a first AD converter (ADC1) 21, a second AD converter (ADC2) 22, and a difference imparting circuit 23.

The difference imparting circuit 23 may be arranged in an input part of the second AD converter 22.

In this embodiment, the first AD converter 21 and the second AD converter 22 apply AD converters having completely the same characteristics. Here, $e_1$ and $e_2$ represent noises generated in the first AD converter 21 and the second AD converter 22, respectively.

The difference imparting circuit 23 configured to provide a difference of at least a fixed signal $\alpha$ (Va) between an input analog signal to the first AD converter 21 and an input analog signal to the second AD converter 22 to input each of the signals to the corresponding first AD converter or second AD converter is arranged.

In the first embodiment, the difference imparting circuit 23 imparts a difference of $2\alpha$ (2 Va) between the input analog signal of the first AD converter 21 and the input analog signal of the second AD converter 22.

The difference imparting circuit 23 is provided as an analog circuit, and includes an adder 231 and a subtractor (adder) 232.

In this embodiment, a signal $(x+\alpha)$ generated by adding the fixed signal $\alpha$ to the input analog signal x is input to the first AD converter 21, and a signal $(x-\alpha)$ generated by subtracting the fixed signal $\alpha$ from the input signal x is input to the second AD converter 22.

A first output signal (digital signal) $b_1$ of the first AD converter 21 and a second output signal (digital signal) $b_2$ of the second AD converter 22 are input to the non-linear compensation part 30.

The non-linear compensation part 30 includes a first non-linear compensator (NCM1) 31 and a second non-linear compensator (NCM2) 32.

The first non-linear compensator 31 compensates a non-linear distortion of the first output signal $b_1$ of the first AD converter 21 depending on a control variable signal c supplied from the filter 50 and outputs the result to the non-linear detection part 40 and the output part 60 as a first signal $d_1$.

The second non-linear compensator 32 compensates a non-linear distortion of the second output signal $b_2$ of the second AD converter 22 depending on the control variable signal c supplied from the filter 50 and outputs the result to the non-linear detection part 40 and the output part 60 as a second signal $d_2$.

FIG. 3 is a diagram explaining a concept of non-linear compensation in a non-linear compensation part according to the embodiment.

In FIG. 3, a horizontal axis represents input, and a vertical axis represents output.

The first non-linear compensator 31 and the second non-linear compensator 32 compensate, as shown in FIG. 3 with solid lines A and B, a non-linear portion in which transmission characteristics between input and output have a linear distortion depending on the control variable signal c so as to converge on a line C shown in the figure with a dashed line.

In this embodiment, the non-linear portion having a non-linear distortion is handled as a portion having a curvature. Therefore, the non-linear compensation part 30 performs compensation processing so that a curvature becomes 0 (approaches 0) depending on the control variable signal c.

The non-linear detection part 40 inputs the first signal $d_1$ by the first non-linear compensator 31 and the second signal $d_2$ by the second non-linear compensator 32.

The non-linear detection part 40 has a function configured to estimate how much a non-linear distortion of the first AD converter 21 and that of the second AD converter 22 are compensated by the first non-linear compensator 31 and the second non-linear compensator 32 depending on the first signal $d_1$ and the second signal $d_2$.

The non-linear detection part 40 estimates a curvature that depends on a signal intensity of an input analog signal on the basis of a difference between the first signal $d_1$ and the second signal $d_2$ with a non-linear distortion as the curvature and generates a control variable signal δ so as to negate the curvature portion to output the signal to the filter 50.

The non-linear detection part 40 includes an intensity acquisition part 41, a curvature acquisition part 42, and a control variable generation part 43.

The intensity acquisition part 41 calculates a signal intensity of the input analog signal x on the basis of an addition signal $(d_1+d_2)$ generated by adding the first signal $d_1$ and the second signal $d_2$.

More specifically, the intensity acquisition part 41 includes an adder 411, an absolute value acquisition part 412, and a first differentiator 413.

The adder 411 outputs the addition signal $(d_1+d_2)$ generated by adding the first signal $d_1$ and the second signal $d_2$ to the absolute value acquisition part 412.

The adder 411 also has a function as the output part 60 configured to add the first signal $d_1$ by the first non-linear compensator 31 and the second signal $d_2$ by the second non-linear compensator 32 to output the signal.

The absolute value acquisition part 412 squares the addition signal $(d_1+d_2)$ to acquire an absolute value signal $[(d_1+d_2)^2]_{[n]}$ of the addition signal $(d_1+d_2)$ and outputs the absolute value signal $[(d_1+d_2)^2]_{[n]}$ to the first differentiator 413.

The first differentiator 413 differentiates the absolute value signal $[(d_1+d_2)^2]$ acquired by the absolute value acquisition part 412 to acquire a signal intensity $[[(d_1+d_2)^2]_{[n]}-[(d_1+d_2)^2]_{[n-1]}]$ of the input analog signal, and outputs the signal intensity to the control variable generation part 43.

The first differentiator 413 includes a flip-flop 4131 configured to latch the absolute value signal $[(d_1+d_2)^2]_{[n-1]}$ in a previous time (n−1). The first differentiator 413 includes a subtractor (adder) 4132 configured to subtract the latched absolute value signal $[(d_1+d_2)^2]_{[n-1]}$ in the previous time (n−1) from the absolute value signal $[(d_1+d_2)^2]_{[n]}$ in this time (n).

The curvature acquisition part 42 acquires a curvature that depends on a signal intensity of the input analog signal x on the basis of a difference signal $(d_2-d_1=-(d_1-d_2))$ generated by subtracting the first signal $d_1$ from the second signal $d_2$. In other words, the curvature acquisition part 42 acquires a signal intensity including curvature components that depend on the signal intensity of the input analog signal x on the basis of the difference signal $(d_2-d_1=-(d_1-d_2))$ that takes a difference between the second signal $d_2$ and the first signal $d_1$.

More specifically, the curvature acquisition part 42 includes a subtractor 421 and a second differentiator 422.

The subtractor 421 acquires the difference signal $(d_2-d_1=-(d_1-d_2))$ generated by subtracting the first signal $d_1$ from the second signal $d_2$ and outputs the difference signal $(d_2-d_1=-(d_1-d_2))_{[n]}$ to the second differentiator 422.

The second differentiator 422 differentiates the difference signal $(d_2-d_1=-(d_1-d_2))_{[n]}$ output by the subtractor 421 and acquires a curvature signal $\{(d_1-d_2)|_{[n]}-(d_1-d_2)|_{[n-1]}\}$ including curvature components that depend on a signal intensity. The second differentiator 422 outputs the curvature signal $\{(d_1-d_2)|_{[n]}-(d_1-d_2)|_{[n-1]}\}$ to the control variable generation part 43.

The second differentiator 422 includes a flip-flop 4221 configured to latch the difference signal $(d_2-d_1=-(d_1-d_2))_{[n-1]}$ in a previous time (n−1).

Further, the second differentiator 422 includes a subtractor (adder) 4222 configured to subtract the latched difference signal $(d_2-d_1=-(d_1-d_2))_{[n-1]}$ in the previous time (n−1) from the difference signal $(d_2-d_1=-(d_1-d_2))_{[n]}$ in this time (n).

The control variable generation part 43 generates the control variable signal δ from which noise components are not yet removed depending on a curvature acquired by the curvature acquisition part 42 and a signal intensity acquired by the intensity acquisition part 41, and outputs the control variable signal δ to the filter 50.

The control variable generation part 43 includes a divider 431.

The divider 431 divides the curvature signal $\{(d_1-d_2)|_{[n]}-(d_1-d_2)|_{[n-1]}\}$ acquired by the second differentiator 422 by a signal intensity $[[(d_1+d_2)^2]_{[n]}-[(d_1+d_2)^2]_{[n-1]}]$ output by the first differentiator 413 to generate the control variable signal δ.

The filter 50 performs filtering processing on the control variable signal δ output from the non-linear detection part 40 and supplies the signal to the first non-linear compensator 31 and the second non-linear compensator 32 of the non-linear compensation part 30 as the control variable signal c that does not depend on noise.

The filter 50 includes a coefficient imparting part 51 and an integrator 52.

The coefficient imparting part 51 multiplies the control variable signal δ output from the non-linear detection part 40 by a filter coefficient μ and outputs the signal μδ to the integrator 52.

The integrator 52 integrates the signal μδ to generate the control variable signal c from which quantization noise and the like are removed.

The integrator 52 includes an adder 521 configured to add the signal μδ and the generated control variable signal c, and a flip-flop 522 configured to latch an output signal of the adder 521.

The output part 60 basically includes an adder 61, and adds the first signal $d_1$ by the first non-linear compensator 31 and the second signal $d_2$ by the second non-linear compensator 32 to output the addition signal $(d_1+d_2)$ as a digital signal y.

Hereinafter, a description will be given of a more detailed operation principle of non-linear compensation processing in the AD conversion apparatus 10 having the above-mentioned structure. Also, the coefficient α will be examined.

In the AD conversion apparatus 10, a signal generated by adding the fixed signal α to the input analog signal x in the difference imparting circuit 23 is input to the first AD converter 21. Also, a signal generated by deducting (subtracting) the fixed signal α from the analog signal x in the difference imparting circuit 23 is input to the second AD converter 22.

The first output signal (digital signal) $b_1$ is input from the first AD converter 21 to the first non-linear compensator 31. The second output signal (digital signal) $b_2$ of the second AD converter 22 is input to the second non-linear compensator 32.

In the first non-linear compensator 31, a non-linear distortion of the first output signal $b_1$ of the first AD converter 21 is compensated depending on the control variable signal c supplied from the filter 50, and the result is output to the non-linear detection part 40 and the output part 60 as the first signal $d_1$.

In the second non-linear compensator 32, a non-linear distortion of the second output signal $b_2$ of the second AD converter 22 is compensated depending on the control variable signal c supplied from the filter 50, and the result is output to the non-linear detection part 40 and the output part 60 as the second signal $d_2$.

In the output part 60, the first signal $d_1$ and the second signal $d_2$ are added, and an addition signal shown in the following formula 2 is output as the output digital signal y of a whole system.

$$y = d_1 + d_2 \qquad \text{(Formula 2)}$$

The first signal $d_1$ and the second signal $d_2$ output from the non-linear compensation part 30 are also input to the non-linear detection part 40 simultaneously in parallel.

In the non-linear detection part 40, a curvature that depends on a signal intensity of an input analog signal is estimated on the basis of a difference between the first signal $d_1$ and the second signal $d_2$ with a non-linear distortion as the curvature, and the control variable signal δ is generated so as to negate the curvature portion.

In the non-linear detection part 40, in order to generate the control variable signal δ, calculation shown in a formula 3 is respectively performed on the first signal $d_1$ and the second signal $d_2$ that have been input, to thereby generate the control variable signal δ from which noise is not yet removed.

$$\delta[n] = -\frac{(d_1 - d_2)|_{[n]} - (d_1 - d_2)|_{[n-1]}}{(d_1 + d_2)^2|_{[n]} - (d_1 + d_2)^2|_{[n-1]}} \qquad \text{(Formula 3)}$$

By the calculation, the non-linear detection part 40 estimates how correctly non-linear characteristics of the first AD converter 21 and the second AD converter 22 are compensated by the first non-linear compensator 31 and the second non-linear compensator 32 of the non-linear compensation part 30.

Also, in order to remove random noise and quantization error generated by the AD converters, the control variable signal δ is input to the least minimum square (LMS) filter 50.

In the filter 50, as shown in a formula 4, the signal is output as the control variable signal c that has been integrated (cumulated) with weighting of the constant coefficient μ and filtered.

$$c[n] = \mu \cdot \sum_{k=0}^{n} \delta[k] \qquad \text{(Formula 4)}$$

The control variable signal c is input to the first non-linear compensator 31 and the second non-linear compensator 32 of the non-linear compensation part 30 as feedback, and varies the non-linear characteristics depending on the variable.

[A Non-Linear Compensation Part]

FIGS. 4A and 4B are diagrams showing a structure example of a non-linear compensator according to the embodiment.

FIG. 4A shows a conceptual structure of a non-linear compensator, and FIG. 4B shows a structure example of a non-linear compensator.

A description will be given of a structure example of the first non-linear compensator 31. The second non-linear compensator 32 has a similar structure to that of the first non-linear compensator 31.

The non-linear compensator 31 includes a cuber 311, a multiplier 312, and an adder 313.

The non-linear compensator 31 cubes the input signal $b_1$ and adds a signal generated by multiplying the cube signal by the control variable c to the input signal $b_1$ to output the first signal $d_1$.

Similarly, the non-linear compensator 32 cubes the input signal $b_2$ and adds a signal generated by multiplying the cube signal by the control variable c to the input signal $b_2$ to output the second signal $d_2$.

That is, the non-linear compensator is configured to perform processing similar to the processing in a formula 5.

$$d = b + c \cdot b^3 \qquad \text{(Formula 5)}$$

Hereinafter, a description will be given to show that this may compensate non-linear characteristics of an AD converter.

Figure 5:
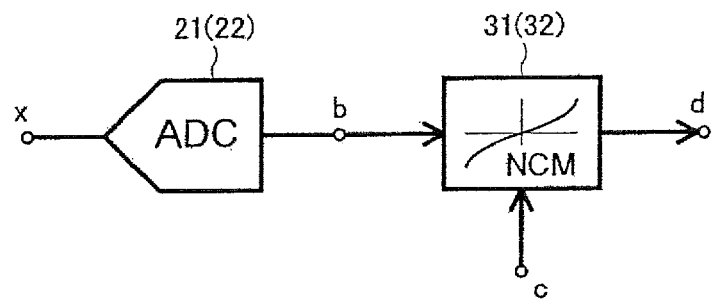
FIG. 5 is a diagram showing a structure in which the AD converter (ADC) and the non-linear compensator (NCM) according to the embodiment are connected to each other.

FIG. 5 is a diagram showing a system in which the AD converter (ADC) and the non-linear compensator (NCM) according to the embodiment are connected to each other.

As shown in FIG. 5, consideration will be given of a system in which the AD converter 21 (22) and the non-linear compensator 31 (32) are connected to each other.

Since characteristics of the AD converter and the non-linear compensator are respectively expressed as the formula 1 and the formula 5, the output d of the system is given by approximation that focuses on a tertiary distortion as the following formula 6.

$$d \approx (a_1 b + a_3 b^3) + c \cdot (a_1 b + a_3 b^3)^3 \approx a_1 b + (a_3 + c \cdot a_1^3) \cdot b^3 \qquad \text{(Formula 6)}$$

Therefore, when the control variable c of the non-linear compensator is set to be correct, which means set to be as shown in the following formula 7, distortion components vanish from the output d of the system by the formula 6.

$$c = -\frac{a_3}{a_1^3} \qquad \text{(Formula 7)}$$

It shows that the non-linear compensator may compensate a distortion of the AD converter.

Practically, as shown in the formula 1, a higher-order distortion exists in the AD converter, and the non-linear compensator may also cause a high-order distortion.

Therefore, as the result, an optimal value of the control variable c of the non-linear compensator to compensate a distortion as much as possible varies a little from the formula 7, but even in such a case, an optimal value capable of compensating most parts of the distortion exists.

[A Non-Linear Detection Part]

As shown in the formula 1, a distortion is a curvature associated with input/output characteristics.

In the non-linear detection part 40, the curvature is estimated and fed back by the formula 3 so that the curvature of the system in which the AD converter and the non-linear compensator are connected to each other converges on 0.

A relationship in the following formula 8 is acquired by substituting the formula 1 that shows characteristics of the AD converter and the formula 5 that shows characteristics of the non-linear compensator into the formula 3 that is for calculation in the non-linear detection part 40.

$$d_1 \approx a_1(x+\alpha) + (a_3 + c \cdot a_1^3)(x+\alpha)^3$$

$$d_2 \approx a_1(x-\alpha) + (a_3 + c \cdot a_1^3)(x-\alpha)^3 \qquad \text{(Formula 8)}$$

A relationship in a formula 9 is acquired from the formula 8.

$$\delta[n] = -\frac{(d_1-d_2)|_{[n]} - (d_1-d_2)|_{[n-1]}}{(d_1+d_2)^2|_{[n]} - (d_1+d_2)^2|_{[n-1]}} \cong -\frac{3}{2}\frac{\alpha}{a_1^2} \cdot (a_3 + c \cdot a_1^3) \quad \text{(Formula 9)}$$

Therefore, when the control variable signal δ converges on 0 by feedback, a relationship in a formula 10 is acquired from the formula 9.

$$c = -\frac{a_3}{a_1^3} \quad \text{(Formula 10)}$$

It is the same as the formula 7, which means when the output δ of the non-linear detection part 40 converges on 0, the non-linear compensators (NCM1 and NCM2) 31 and 32 compensate AD converters (ADC1 and ADC2) 21 and 22.

As already mentioned, practically a higher-order distortion exists in the AD converter, and the non-linear compensator may also cause a high-order distortion. Therefore, the formula 9 itself is not so accurate, but the control variable c of the non-linear compensator configured to minimize a total amount of a distortion exists and the non-linear detection part 40 helps the control variable c converge on the optimal value by minimizing a curvature.

[Noise Inside ADC (Quantization Noise and Circuit Noise)]

A description will be given of noise inside an AD converter and removal processing thereof.

Figure 6:
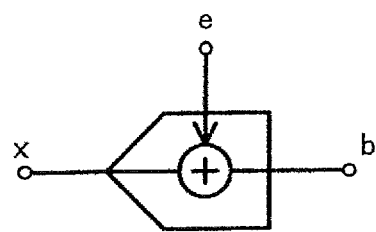
FIG. 6 is a diagram explaining noise (quantization noise and circuit noise) inside an AD conversion apparatus.

FIG. 6 is a diagram explaining noise inside an AD converter (quantization noise and circuit noise).

Though noise is ignored in the formula 1 and the formula 8 that show transmission characteristics of an AD converter, various types of noise (quantization noise and circuit noise) are also injected into an actual AD converter, as shown in FIG. 6.

The control variable signal δ that is an output of the non-linear detection part 40 is input to the LMS filter 50 as a filter to help the control variable signal c converge without dependence on such a random noise. When the LMS filter coefficient μ is increased, the control variable signal c converges at high speed. On the other hand, however, the above-mentioned various types of noise are added to the control variable c, with the result that AD conversion accuracy deteriorates.

When the filter coefficient μ is reduced, the various types of noise are filtered sufficiently enough not to be added to the control variable c, but it takes a long time for the control variable c to converge.

As described above, the AD conversion apparatus 10 according to the first embodiment includes two AD converters that have the same distortion components generated in AD converters to be applied to a receiver in radio communication and furthermore an audio device, a medical measuring device, and the like.

The AD conversion apparatus 10 includes the circuit 23 configured to multiply inputs of the respective AD converters 21 and 22 by appropriate coefficients in a preceding stage of the AD converter 22.

In the AD conversion apparatus 10, a digital signal processing part that includes the non-linear compensation part 30, the non-linear detection part 40, the least minimum square filter 50, and the output part 60 is arranged in a subsequent stage of the AD converters 21 and 22.

With the AD conversion apparatus 10 having the above-mentioned structure according to the embodiment, characteristics of an AD converter in which a dynamic range is limited by a distortion may significantly improve.

The technology especially validates in a design of an AD converter in low power supply voltage.

2. Second Embodiment

Figure 7:
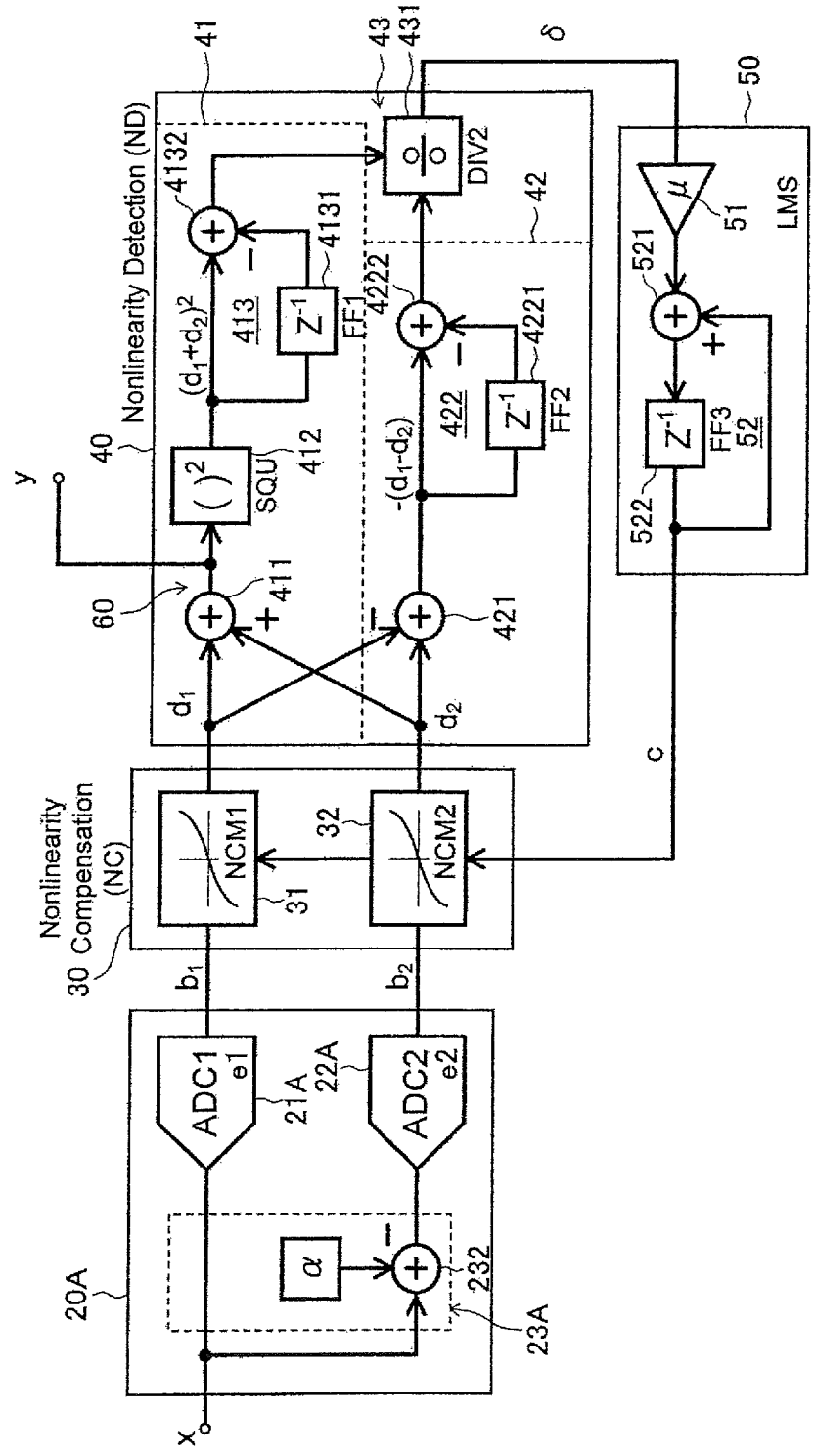
FIG. 7 is a diagram showing a structure of an AD conversion apparatus that includes a non-linear (distortion) compensation function according to a second embodiment.

FIG. 7 is a diagram showing a structure of an AD conversion apparatus that includes a non-linear (distortion) compensation function according to a second embodiment.

An AD conversion apparatus 10A according to the second embodiment is different from the AD conversion apparatus 10 in the first embodiment in a point in which a difference of the fixed signal α is imparted only to an input signal of the second AD converter 22 in a difference imparting circuit 23A of an AD conversion part 20A.

That is, in the difference imparting circuit 23A, the subtractor 232 is arranged on an input side of the second AD converter 22.

The difference imparting circuit 23A inputs the input analog signal x to the first AD converter 21, and subtracts the fixed signal α from the input analog signal x to input the signal to the second AD converter 22.

[Regarding α]

In the structure in FIG. 2, the constant fixed signal α is respectively added/subtracted with respect to the first AD converter 21 and the second AD converter 22. As shown in the second embodiment, however, the structure gives the same effect when the constant fixed signal α is added/subtracted with respect to only one of the AD converters.

In this case, though the output y of the system includes the fixed signal α, it is not a problem in use of removing a fixed signal (DC signal) output from an AD converter in a subsequent-stage digital circuit. Examples of this structure include a low interface (Low-IF) architecture in radio communication.

Embodiment Example of Constant Gain α

The structures of the present technology (FIG. 2 and FIG. 7) do not depend on a structure of an AD converter itself. Depending on a structure of an AD converter, however, a structure in which an optimal constant signal α is imparted is different. An embodiment example of such a structure will be described.

3. Third Embodiment

Figure 8:
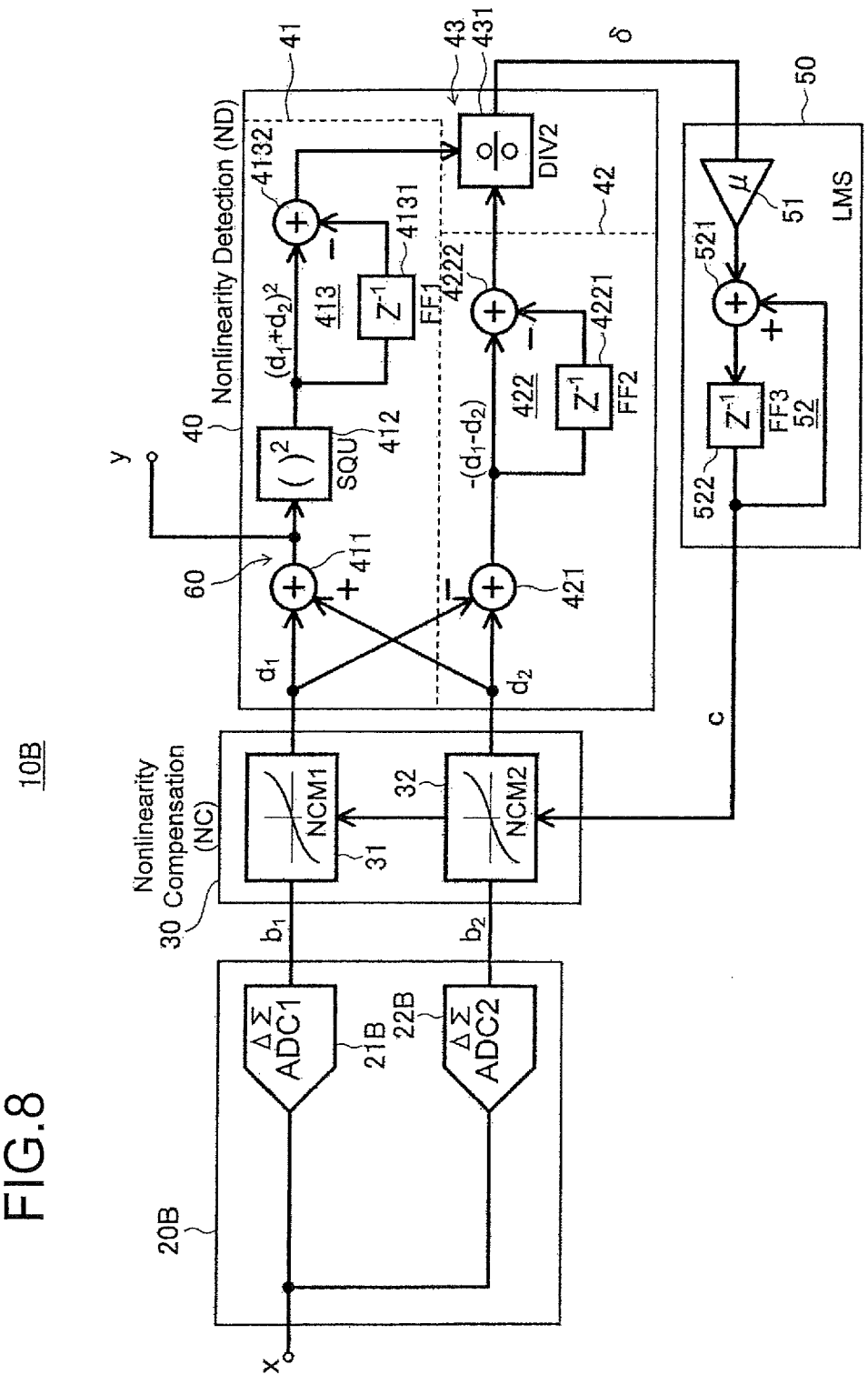
FIG. 8 is a diagram showing a structure of an AD conversion apparatus that includes a non-linear (distortion) compensation function according to a third embodiment.

FIG. 8 is a diagram showing a structure of an AD conversion apparatus that includes a non-linear (distortion) compensation function according to the third embodiment.

An AD conversion apparatus 10B according to the third embodiment is different from the AD conversion apparatus 10 in the first embodiment in a point in which ΔΣ-type AD converters having a continuous-time system are applied as a first AD converter 21B and a second AD converter 22B in an AD conversion part 20B.

The AD conversion part 20B according to the third embodiment shares the difference imparting circuit 23 in input parts of the AD converters.

In the third embodiment, in addition to a resistance $R_{in}$ for an input signal, an input resistance for the fixed signal α (Va) is also connected to either of the input part of the first AD converter 21B and the input part of the second AD converter 22B.

Figure 9:
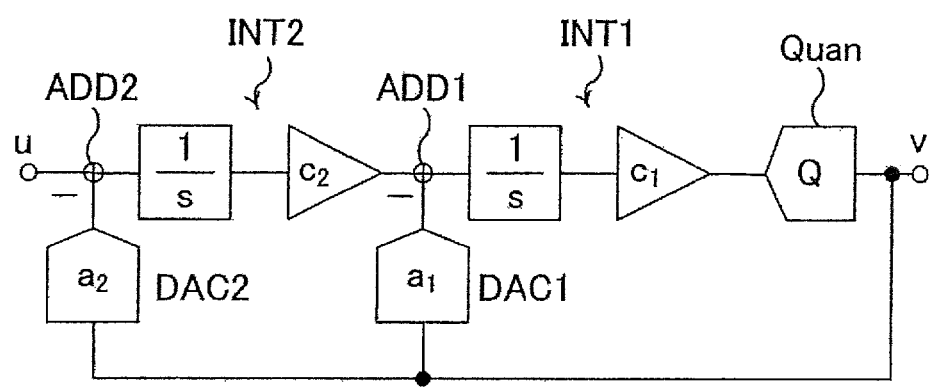
FIG. 9 is a circuit diagram showing a structure example of a $\Delta\Sigma$ modulator as a $\Delta\Sigma$-type AD converter in FIG. 8.

FIG. 9 is a circuit diagram showing a structure example of a ΔΣ modulator as the ΔΣ-type AD converter in FIG. 8.

A ΔΣ modulator 200 in FIG. 9 is formed as a continuous-time system second-order 1-bit feedback-type ΔΣ modulator.

The ΔΣ modulator 200 in FIG. 9 includes integrators INT1 and INT2, a quantizer Quan, adders ADD1 and ADD2, and digital-to-analog (DA) converters DAC1 and DAC2.

In FIG. 9, u represents an analog input signal and v represents a digital output signal. Also, $a_1$ and $a_2$ represent feedback gains of the DA converters DAC1 and DAC2 respectively, and $c_1$ and $c_2$ represent gains of the integrators INT1 and INT2. Q represents an effective gain of the quantizer Quan.

A noise transmission function (NTF) for v of quantization noise generated in the quantizer Quan shows high-pass-type frequency characteristics.

This means that noise shaping is performed on the quantization noise generated in the quantizer Quan due to a feedback effect in the ΔΣ modulator 200, resulting in a high SN ratio in a signal band by movement to a high frequency region.

FIGS. 10A and 10B are diagrams showing a structure example of an input part of the ΔΣ modulator in FIG. 9.

An input part 210 of the ΔΣ modulator 200 in FIG. 10 is structured as a circuit configured to receive a differential input signal.

For example, in an AD converter such as a continuous-time ΔΣ modulator (AD converter), the input part 210 is generally structured as shown in FIG. 10A.

The input part 210 includes input resistances $R_{in}21$ and $R_{in}22$, capacitances C21 and C22, and an operation amplifier OPA21 for differential input/output.

Also, the input part 210 includes a first analog signal input terminal $T_{vinp}$ and a second analog signal input terminal $T_{vinm}$.

The structure corresponds to a part of the integrator INT2 in FIG. 9.

Though a feedback route including a load resistance from DAC2 is omitted in FIG. 10A, a feedback route including a load resistance is practically connected on an input side of the operation amplifier OPA 21.

In the second embodiment, as shown in FIG. 10B, input resistances $R_{in}23$ and $R_{in}24$ for the fixed signal α (Va) are included.

Also, the input part 210 includes a first fixed signal input terminal $T_{vap}$ and a second fixed signal input terminal $T_{vam}$.

The first analog signal input terminal $T_{vinp}$ is connected to a positive side input terminal (represented by plus sign) of the operation amplifier OPA21 through the input resistance $R_{in}21$.

The second analog signal input terminal $T_{vinm}$ is connected to a negative side input terminal (represented by minus sign) of the operation amplifier OPA21 through the input resistance $R_{in}22$.

The capacitance C21 is connected between the negative side output terminal (represented by minus sign) and the positive side input terminal (represented by plus sign) of the operation amplifier OPA21.

The capacitance C22 is connected between the positive side output terminal (represented by plus sign) and the negative side output terminal (represented by minus sign) of the operation amplifier OPA21.

The first fixed signal input terminal $T_{vap}$ is connected to the positive side input terminal (represented by plus sign) of the operation amplifier OPA21 through the input resistance $R_{in}23$.

The second fixed signal input terminal $T_{vam}$ is connected to the negative side input terminal (represented by minus sign) of the operation amplifier OPA21 through the input resistance $R_{in}24$.

In the third embodiment, as shown in FIG. 10B, the fixed voltage Va (α) is connected to the operation amplifier OPA21 using the input resistances $R_{in}23$ and $R_{in}24$, and addition/subtraction of the fixed signal α is realized in a form combined with an AD converter.

According to the third embodiment, a similar effect to that of the above-mentioned first embodiment may be acquired.

4. Fourth Embodiment

Figure 11:
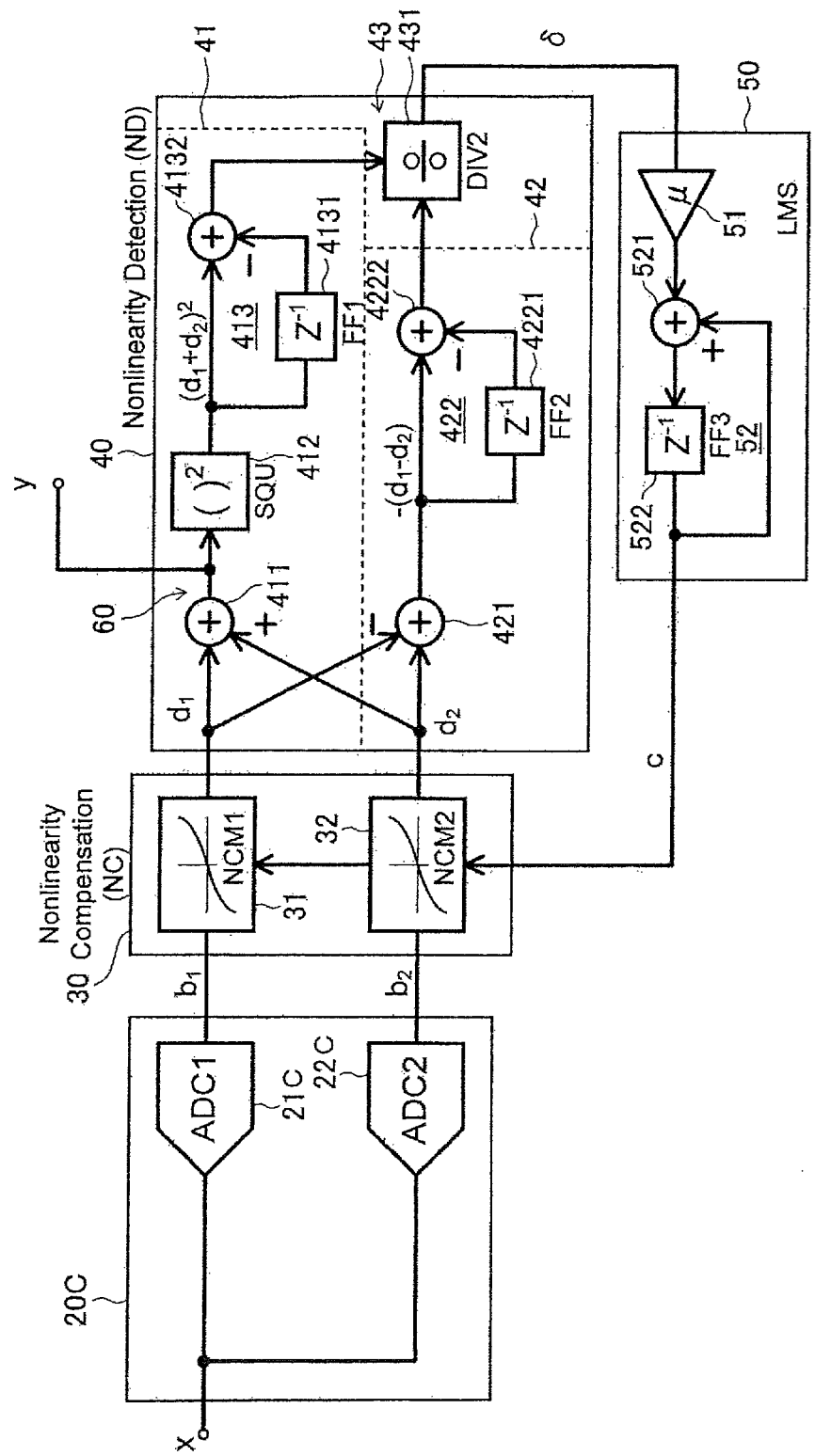
FIG. 11 is a diagram showing a structure of an AD conversion apparatus that includes a non-linear (distortion) compensation function according to a fourth embodiment.

FIG. 11 is a diagram showing a structure of an AD conversion apparatus that includes a non-linear (distortion) compensation function according to the fourth embodiment.

An AD conversion apparatus 10C according to the fourth embodiment is different from the AD conversion apparatus 10 in the first embodiment in a point in which pipeline-type AD converters are applied as a first AD converter 21C and a second AD converter 22C.

In the fourth embodiment, in addition to a capacitance $C_{in}$ for an input signal, an input capacitance for the fixed signal α (Va) is also connected to either of the input part of the first AD converter 21C and the input part of the second AD converter 22C.

Figures 12, 12A, 12B:
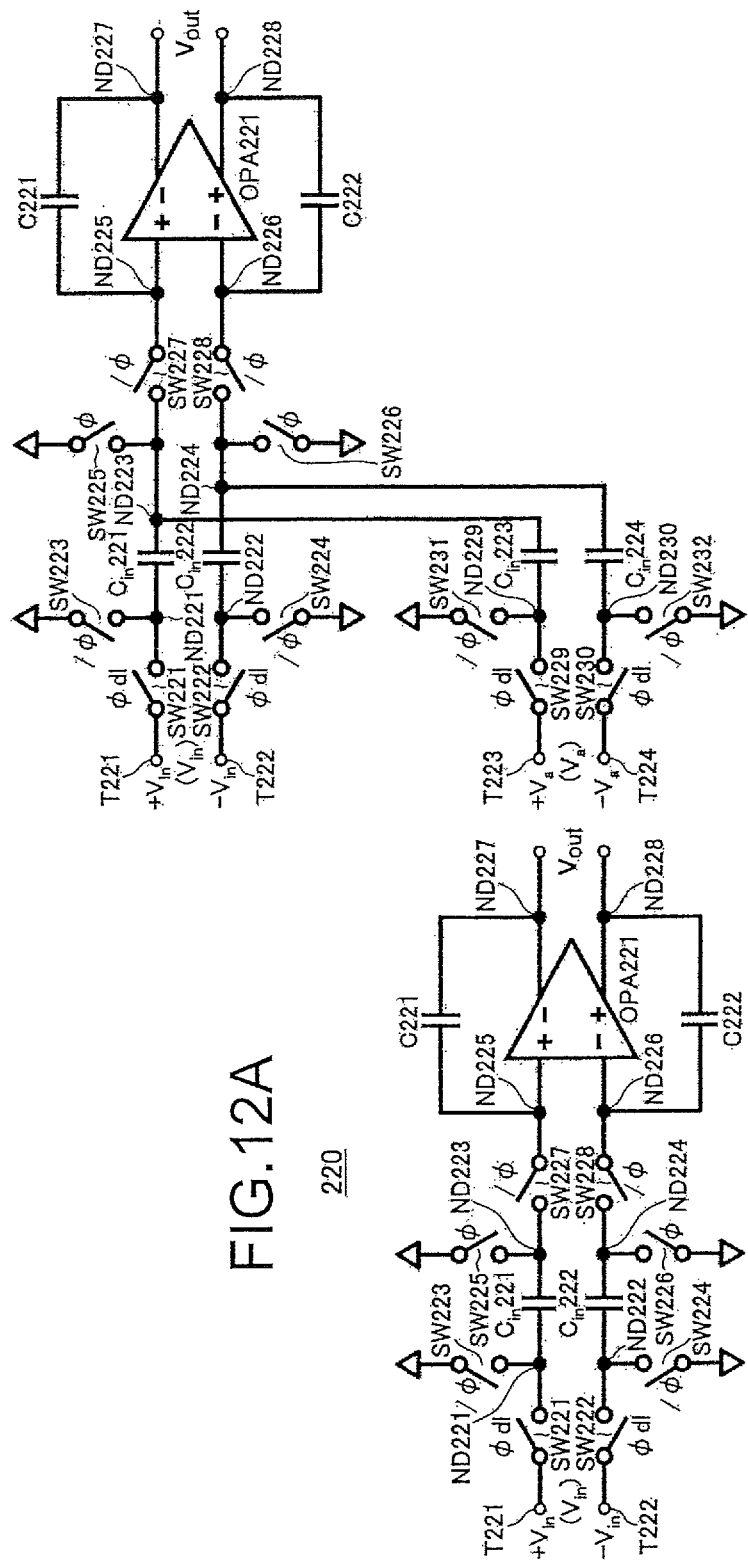
FIG. 12 are circuit diagrams showing a structure example of an input part of a pipeline-type AD converter in FIG. 11.

FIGS. 12A and 12B are circuit diagrams showing a structure example of an input part of the pipeline-type AD converter in FIG. 11.

For example, in an AD converter such as a continuous-time ΔΣ modulator (AD converter), an input part 210 thereof is generally structured as shown in FIG. 12A.

An input-stage circuit 220 generally includes an operation amplifier OPA221, capacitances C221 and C222, and sampling capacitances $C_{in}221$ and $C_{in}222$, as shown in FIG. 12A.

The input-stage circuit 220 includes input terminals T221 and T222 of differential input voltages $+V_{in}$ and $-V_{in}$, switches SW221 to SW228, and nodes ND221 to ND228.

Also, in the fourth embodiment, as shown in FIG. 12B, input resistances $C_{in}223$ and $C_{in}224$ for the fixed signal α (Va) are included.

The input-stage circuit 220 includes input terminals T223 and T224 of the differential input voltages +Va and −Va, switches SW229 to SW232, and nodes ND229 and ND230.

The sampling capacitance $C_{in}221$ is connected between the node ND221 and the node ND223, and the sampling capacitance $C_{in}222$ is connected between the node ND222 and the node ND224.

The capacitance C221 is connected between the first input side node ND225 and the first output side node ND227 of the operation amplifier OPA221. The capacitance C222 is connected between the second input side node ND226 and the second output side node ND 228 of the operation amplifier OPA221.

The switch SW221 is connected between the input terminal T221 and the node ND221, and is switched ON/OFF by a signal Φdl. The switch SW222 is connected between the input terminal T222 and the node ND222, and is switched ON/OFF by the signal Φdl.

The switch SW223 is connected between the node ND221 and the reference potential, and is switched ON/OFF by an inversion signal /Φ (/ represents inversion) of a signal Φ.

The switch SW224 is connected between the node ND222 and the reference potential, and is switched ON/OFF by the inversion signal /Φ of the signal Φ.

The switch SW225 is connected between the node ND223 and the reference potential, and is switched ON/OFF by the signal Φ.

The switch SW226 is connected between the node ND224 and the reference potential, and is switched ON/OFF by the signal Φ.

The switch SW227 is connected between the node ND223 and the node ND225, and is switched ON/OFF by the inversion signal /Φ of the signal Φ.

The switch SW228 is connected between the node ND224 and the node ND226, and is switched ON/OFF by the inversion signal /Φ of the signal Φ.

The sampling capacitance $C_{in}223$ is connected between the node ND229 and the node ND223, and the sampling capacitance $C_{in}224$ is connected between the node ND230 and the node ND224.

The switch SW229 is connected between the input terminal T223 and the node ND229, and is switched ON/OFF by the signal Φdl. The switch SW230 is connected between the input terminal T224 and the node ND230, and is switched ON/OFF by the signal Φdl.

The switch SW231 is connected between the node ND229 and the reference potential, and is switched ON/OFF by the inversion signal /Φ (/ represents inversion) of the signal Φ.

The switch SW232 is connected between the node ND230 and the reference potential, and is switched ON/OFF by the inversion signal /Φ of the signal Φ.

The sampling capacitance $C_{in}221$ samples an input voltage $V_{in}$ in an ON state of the switch SW225, and generates the sampled voltage $V_{in}$ on the node ND223 side to output a voltage signal thereof in an OFF state of the switch SW225.

The sampling capacitance $C_{in}222$ samples an input voltage $-V_{in}$ in an ON state of the switch SW226, and generates the sampled voltage $-V_{in}$ on the node ND224 side to output a voltage signal thereof in an OFF state of the switch SW226.

The sampling capacitance $C_{in}223$ samples an input voltage Va in an ON state of the switch SW225, and generates the sampled voltage Va on the node ND223 side to output a voltage signal thereof in an OFF state of the switch SW225.

The sampling capacitance $C_{in}224$ samples an input voltage −Va in an ON state of the switch SW226, and generates the sampled voltage −Va on the node ND224 side to output a voltage signal thereof in an OFF state of the switch SW226.

In the fourth embodiment, as shown in FIG. 12B, the fixed voltage Va (α) is connected to the operation amplifier OPA21 using the input capacitances $C_{in}223$ and $C_{in}224$ and the switches SW229 and SW230 as similar to an input signal route. With this structure, addition/subtraction of the fixed signal α is realized in a form combined with an AD converter.

Figure 13:
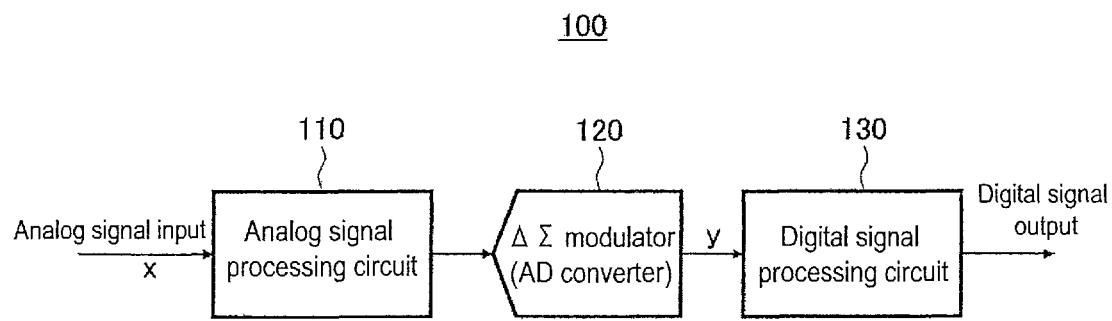
FIG. 13 is a block diagram showing a structure example of a signal processing system according to a fifth embodiment.

For example, in an AD converter such as a pipeline-type AD converter and a discrete-time ΔΣ AD converter, an input part thereof may be structured as shown in FIG. 13, and includes capacitances, switches, and the operation amplifier OPA221.

A gain of the circuit is determined by a ratio of capacitances.

Therefore, in the structure, the constant gain α is realized in a form combined with an AD converter by multiplying a value of the input capacitance $C_{in}$ of the second AD converter 22C by α times.

According to the fourth embodiment, a similar effect to that of the above-mentioned first embodiment may be acquired.

5. Fifth Embodiment

FIG. 13 is a block diagram showing a structure example of a signal processing system according to the fifth embodiment.

A signal processing system 100 is formed as a signal processing system applicable to the AD conversion apparatuses 10 to 10C according to the first to fourth embodiments. As an example of the signal processing system 100, a signal processing system for a receiving device for communication equipment is illustrated.

The signal processing system 100 includes an analog signal processing circuit 110, an AD converter 120, and a digital signal processing circuit 130.

In the signal processing system 100, any one of the AD conversion apparatuses 10 to 10C according to the first to fourth embodiments is applicable as the AD converter 120.

In the signal processing system 100 in FIG. 13, size reduction and high efficiency are expected by performing signal processing with the digital signal processing circuit 130 as much as possible to reduce a scale of the analog signal processing circuit 110.

In order to realize a system as mentioned above, that is, to perform signal processing with the digital signal processing circuit 130 instead of the analog signal processing circuit 110 that has performed the signal processing in related art, AD conversion should be performed with information loss of original signals as least as possible. Therefore, an AD converter having a high SN ratio is favorable.

In order to realize a higher SN ratio, there are two conditions that should be met: <1> to increase resolution (the number of bits); and <2> to reduce noise in a circuit. Also, an AD converter should have a high conversion speed. This is because an information amount to be handled has increased with the sophistication of a system.

As an example of the AD converter 120 that meets these conditions, the AD conversion apparatus 10C according to the fourth embodiment, which functions as a pipeline-type AD converter, is applicable.

In the embodiments mentioned above, both single operation and differential operation are applicable.

The present technology may also be structured as described below.

(1) An analog-to-digital conversion apparatus including:

a first analog-to-digital converter configured to convert an input analog signal into a digital signal;

a second analog-to-digital converter configured to convert an input analog signal into a digital signal;

a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively;

a first non-linear compensation part configured to compensate a non-linear distortion of a first output signal of the first analog-to-digital converter depending on a control variable signal to be supplied;

a second non-linear compensation part configured to compensate a non-linear distortion of a second output signal of the second analog-to-digital converter depending on the control variable signal to be supplied; and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

(2) The analog-to-digital conversion apparatus according to (1), in which
the non-linear detection part includes
an intensity acquisition part configured to calculate the signal intensity of the input analog signal on the basis of an addition signal generated by adding the first signal and the second signal,
a curvature acquisition part configured to acquire the curvature that depends on the signal intensity of the input analog signal on the basis of a difference signal generated by taking a difference between the second signal and the first signal, and
a control variable generation part configured to generate the control variable signal depending on the curvature acquired by the curvature acquisition part and the signal intensity acquired by the intensity acquisition part.

(3) The analog-to-digital conversion apparatus according to (2), in which
the intensity acquisition part includes
an adder configured to add the first signal and the second signal to output the addition signal,
an absolute value acquisition part configured to acquire an absolute value signal of the addition signal by the adder, and
a first differentiator configured to differentiate the absolute value signal acquired by the absolute value acquisition part to acquire the signal intensity of the input analog signal,
the curvature acquisition part includes
a subtractor configured to output the difference signal generated by taking the difference between the second signal and the first signal, and
a second differentiator configured to differentiate the difference signal by the subtractor to acquire the curvature that depends on the signal intensity of the input analog signal, and
the control variable generation part includes
a divider configured to divide the curvature acquired by the second differentiator by the signal intensity output by the first differentiator to generate the control variable signal.

(4) The analog-to-digital conversion apparatus according to any one of (1) to (3), further including
a filter configured to perform filter processing on the control variable signal output from the non-linear detection part and supply a resultant signal to the first non-linear compensation part and the second non-linear compensation part as a control variable signal that does not depend on noise.

(5) The analog-to-digital conversion apparatus according to any one of (1) to (4), further including
an output part configured to add the first signal by the first non-linear compensation part and the second signal by the second non-linear compensation part to output a resultant signal.

(6) The analog-to-digital conversion apparatus according to any one of (1) to (5), in which
the difference imparting part
adds the fixed signal α to the input analog signal and inputs a resultant signal to the first analog-to-digital converter, and
subtracts the fixed signal α from the input analog signal and inputs a resultant signal to the second analog-to-digital converter.

(7) The analog-to-digital conversion apparatus according to any one of (1) to (5), in which
the difference imparting part
inputs the input analog signal to the first analog-to-digital converter, and
subtracts the fixed signal α from the input analog signal and inputs a resultant signal to the second analog-to-digital converter.

(8) The analog-to-digital conversion apparatus according to any one of (1) to (7), in which
the first analog-to-digital converter and the second analog-to-digital converter are each formed by a $\Delta\Sigma$ modulator, the $\Delta\Sigma$ modulator including
at least one integrator,
a quantizer including an integration capacitance and configured to quantize an output signal of the integrator to output a digital signal,
at least one digital-to-analog converter configured to convert the digital signal by the quantizer into an analog signal and feed back the signal to an input side of the integrator, and
a first input resistance to which the input analog signal is input, and
at least one of the first analog-to-digital converter and the second analog-to-digital converter further includes
a second input resistance to which the fixed signal is input.

(9) The analog-to-digital conversion apparatus according to any one of (1) to (7), in which
at least one of the first analog-to-digital converter and second analog-to-digital converter includes a pipeline-type analog-to-digital converter including
a first input capacitance configured to sample the input analog signal in an input stage, and
a second input capacitance configured to sample the fixed signal in an input stage.

(10) A signal processing system, including
an analog-to-digital conversion apparatus configured to convert an analog signal from an analog signal processing system into a digital signal, the analog-to-digital conversion apparatus including
a first analog-to-digital converter configured to convert an input analog signal into a digital signal,
a second analog-to-digital converter configured to convert an input analog signal into a digital signal,
a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively,
a first non-linear compensation part configured to compensate a non-linear distortion of a first output signal of the first analog-to-digital converter depending on a control variable signal to be supplied,
a second non-linear compensation part configured to compensate a non-linear distortion of a second output signal of the second analog-to-digital converter depending on the control variable signal to be supplied, and
a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

The present disclosure contains subject matter related to that disclosed in Japanese Priority Patent Application JP 2011-121921 filed in the Japan Patent Office on May 31, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital conversion apparatus comprising:
a first analog-to-digital converter configured to convert an input analog signal into a digital signal;
a second analog-to-digital converter configured to convert an input analog signal into a digital signal;
a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively;
a first non-linear compensation part configured to compensate a non-linear distortion of a first output signal of the first analog-to-digital converter depending on a control variable signal to be supplied;
a second non-linear compensation part configured to compensate a non-linear distortion of a second output signal of the second analog-to-digital converter depending on the control variable signal to be supplied; and
a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

2. The analog-to-digital conversion apparatus according to claim 1, wherein
the non-linear detection part includes
an intensity acquisition part configured to calculate the signal intensity of the input analog signal on the basis of an addition signal generated by adding the first signal and the second signal,
a curvature acquisition part configured to acquire the curvature that depends on the signal intensity of the input analog signal on the basis of a difference signal generated by taking a difference between the second signal and the first signal, and
a control variable generation part configured to generate the control variable signal depending on the curvature acquired by the curvature acquisition part and the signal intensity acquired by the intensity acquisition part.

3. The analog-to-digital conversion apparatus according to claim 2, wherein
the intensity acquisition part includes
an adder configured to add the first signal and the second signal to output the addition signal,
an absolute value acquisition part configured to acquire an absolute value signal of the addition signal by the adder, and
a first differentiator configured to differentiate the absolute value signal acquired by the absolute value acquisition part to acquire the signal intensity of the input analog signal,
the curvature acquisition part includes
a subtractor configured to output the difference signal generated by taking the difference between the second signal and the first signal, and
a second differentiator configured to differentiate the difference signal by the subtractor to acquire the curvature that depends on the signal intensity of the input analog signal, and
the control variable generation part includes
a divider configured to divide the curvature acquired by the second differentiator by the signal intensity output by the first differentiator to generate the control variable signal.

4. The analog-to-digital conversion apparatus according to claim 1, further comprising
a filter configured to perform filter processing on the control variable signal output from the non-linear detection part and supply a resultant signal to the first non-linear compensation part and the second non-linear compensation part as a control variable signal that does not depend on noise.

5. The analog-to-digital conversion apparatus according to claim 1, further comprising
an output part configured to add the first signal by the first non-linear compensation part and the second signal by the second non-linear compensation part to output a resultant signal.

6. The analog-to-digital conversion apparatus according to claim 1, wherein
the difference imparting part
adds the fixed signal α to the input analog signal and inputs a resultant signal to the first analog-to-digital converter, and
subtracts the fixed signal α from the input analog signal and inputs a resultant signal to the second analog-to-digital converter.

7. The analog-to-digital conversion apparatus according to claim 1, wherein
the difference imparting part
inputs the input analog signal to the first analog-to-digital converter, and
subtracts the fixed signal α from the input analog signal and inputs a resultant signal to the second analog-to-digital converter.

8. The analog-to-digital conversion apparatus according to claim 1, wherein
the first analog-to-digital converter and the second analog-to-digital converter are each formed by a ΔΣ modulator, the ΔΣ modulator including
at least one integrator,
a quantizer including an integration capacitance and configured to quantize an output signal of the integrator to output a digital signal,
at least one digital-to-analog converter configured to convert the digital signal by the quantizer into an analog signal and feed back the signal to an input side of the integrator, and
a first input resistance to which the input analog signal is input, and
at least one of the first analog-to-digital converter and the second analog-to-digital converter further includes
a second input resistance to which the fixed signal is input.

9. The analog-to-digital conversion apparatus according to claim 1, wherein
at least one of the first analog-to-digital converter and the second analog-to-digital converter includes a pipeline-type analog-to-digital converter including
a first input capacitance configured to sample the input analog signal in an input stage, and
a second input capacitance configured to sample the fixed signal in an input stage.

10. A signal processing system, comprising
an analog-to-digital conversion apparatus configured to convert an analog signal from an analog signal processing system into a digital signal, the analog-to-digital conversion apparatus including
a first analog-to-digital converter configured to convert an input analog signal into a digital signal,
a second analog-to-digital converter configured to convert an input analog signal into a digital signal,
a difference imparting part configured to provide a difference of at least a fixed signal α between an input analog signal to the first analog-to-digital converter and an input analog signal to the second analog-to-digital converter, to input the input analog signal to the first analog-to-digital converter and the input analog signal to the second analog-to-digital converter, respectively,
a first non-linear compensation part configured to compensate a non-linear distortion of a first output signal of the first analog-to-digital converter depending on a control variable signal to be supplied,
a second non-linear compensation part configured to compensate a non-linear distortion of a second output signal of the second analog-to-digital converter depending on the control variable signal to be supplied, and
a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a difference between the first signal and the second signal with the non-linear distortion as the curvature and generate the control variable signal to negate a portion corresponding to the curvature to thereby output the control variable signal to the first non-linear compensation part and the second non-linear compensation part.

* * * * *